(12) United States Patent
Lof et al.

(10) Patent No.: US 7,197,828 B2
(45) Date of Patent: Apr. 3, 2007

(54) LITHOGRAPHIC APPARATUS AND DEVICE MANUFACTURING METHOD UTILIZING FPD CHUCK Z POSITION MEASUREMENT

(75) Inventors: Joeri Lof, Eindhoven (NL); Jeroen Hendrik Gerardus Christiaan Rutten, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 50 days.

(21) Appl. No.: 11/140,581

(22) Filed: May 31, 2005

(65) Prior Publication Data

US 2006/0265889 A1   Nov. 30, 2006

(51) Int. Cl.
  *G01B 11/14* (2006.01)
(52) U.S. Cl. .................. 33/1 M; 33/533; 356/614
(58) Field of Classification Search .............. 33/1 M, 33/533, 551, 706, 707, 708, 701; 250/201.1, 250/548, 559.39, 491.1, 492.22; 356/399, 356/400, 401, 601, 614; 355/61, 62
See application file for complete search history.

(56) References Cited

U.S. PATENT DOCUMENTS

| | | | |
|---|---|---|---|
| 4,475,289 A * | 10/1984 | Nelle | 33/706 |
| 5,229,872 A | 7/1993 | Mumola | |
| 5,296,891 A | 3/1994 | Vogt et al. | |
| 5,495,279 A * | 2/1996 | Sandstrom | 347/258 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,640,008 A * | 6/1997 | Bosch et al. | 250/237 G |
| 5,677,703 A | 10/1997 | Bhuva et al. | |
| 5,808,797 A | 9/1998 | Bloom et al. | |
| 5,832,416 A * | 11/1998 | Anderson | 702/95 |
| 5,982,553 A | 11/1999 | Bloom et al. | |
| 6,133,986 A | 10/2000 | Johnson | |
| 6,177,980 B1 | 1/2001 | Johnson | |
| 6,583,413 B1 * | 6/2003 | Shinada et al. | 250/310 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2002/0072012 A1* | 6/2002 | Nakasugi et al. | 430/296 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0128461 A1* | 6/2005 | Beems et al. | 355/72 |

FOREIGN PATENT DOCUMENTS

| | | | |
|---|---|---|---|
| JP | 11272415 A | * | 10/1999 |
| WO | WO 98/33096 | | 7/1998 |
| WO | WO 98/38597 | | 9/1998 |

* cited by examiner

*Primary Examiner*—R. Alexander Smith
(74) *Attorney, Agent, or Firm*—Sterne, Kessler, Goldstein & Fox P.L.L.C.

(57) ABSTRACT

A lithographic apparatus comprising a first frame and a second frame, the first frame and the second frame being moveable in a first direction relative to one another. The first frame is provided with a ruler having distance indicators disposed in the first direction for monitoring by an associated ruler monitoring sensor. The second frame is provided with a second sensor arranged to measure the distance between the second sensor and the ruler in a second direction orthogonal to the first direction, using the ruler as a reference surface.

25 Claims, 6 Drawing Sheets

LITHOGRAPHIC APPARATUS AND DEVICE MANUFACTURING METHOD UTILIZING FPD CHUCK Z POSITION MEASUREMENT

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate can be rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

During exposure of a substrate (which can be a flat panel substrate) the substrate may not properly coincide with the focal plane of projection optics used to project the projection beam. This can cause the pattern projected by the optical engines onto the substrate to be out of focus. Due to this defocus, the pattern may not be properly formed, with the result that elements of circuits built by the pattern may not function properly.

Therefore, what is needed is a system and method to more effectively align features.

SUMMARY

According to one embodiment of the invention, there is provided a lithographic apparatus comprising a first frame and a second frame. The first frame and the second frame are moveable in a first direction relative to one another. The first frame is provided with a ruler having distance indicators disposed in the first direction for monitoring by an associated ruler monitoring sensor. The second frame is provided with a second sensor arranged to measure the distance between the second sensor and the ruler in a second direction orthogonal to the first direction, using the ruler as a reference surface.

According to one embodiment of the present invention, there is provided a measurement apparatus comprising a ruler having distance indicators disposed in a first direction for monitoring by an associated ruler monitoring sensor and a second sensor arranged to measure the distance between the second sensor and the ruler in a second direction orthogonal to the first direction, using the ruler as a reference surface. frame and a substrate holder. The frame being provided with a height sensor arranged to measure the height of a substrate held by the substrate holder and projection optics arranged to project a desired pattern onto the substrate. The substrate holder is provided with a ruler having distance indicators disposed in a first direction. The method comprises using a second sensor located adjacent to the height sensor to measure the height of the ruler, moving the substrate holder and substrate relative to the projection optics, using a third sensor located adjacent to the projection optics to measure the height of the ruler, determining a correction offset based upon the difference between the measured heights of the ruler, and using the correction offset together with the measured height of the substrate to adjust the projection optics such the projection optics project an in-focus pattern onto the substrate.

According to one embodiment of the invention, there is provided a method of lithographic exposure using a lithographic apparatus comprising a first frame and a second frame. The first frame is provided with a ruler having distance indicators disposed in a first direction. The second frame is provided with a plurality of sensors arranged to measure the distance between the plurality of sensors and the ruler in a second direction orthogonal to the first direction, using the ruler as a reference surface. The method comprises measuring the surface flatness of the ruler, then using the plurality of sensors to measure movement of the first frame relative to the second frame in the second direction, during scanning movement of the first frame relative to the second frame in the first direction.

According to one embodiment of the invention, there is provided a measurement method using a ruler having distance indicators disposed in a first direction for monitoring by an associated ruler monitoring sensor. The method comprises using a second sensor to measure the distance between the second sensor and the ruler in a second direction orthogonal to the first direction, using the ruler as a reference surface.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
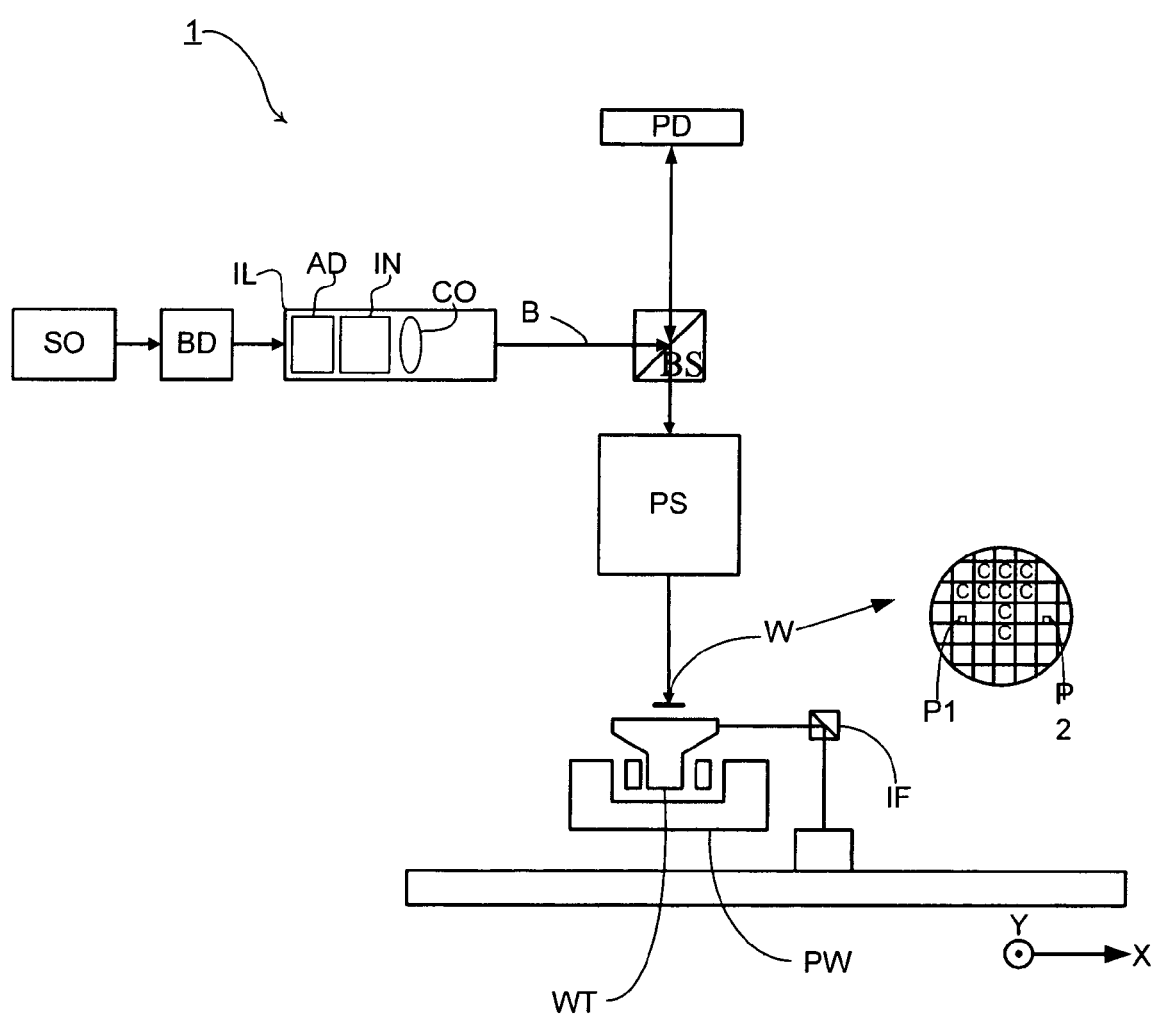
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts a lithographic apparatus according to one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at least 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
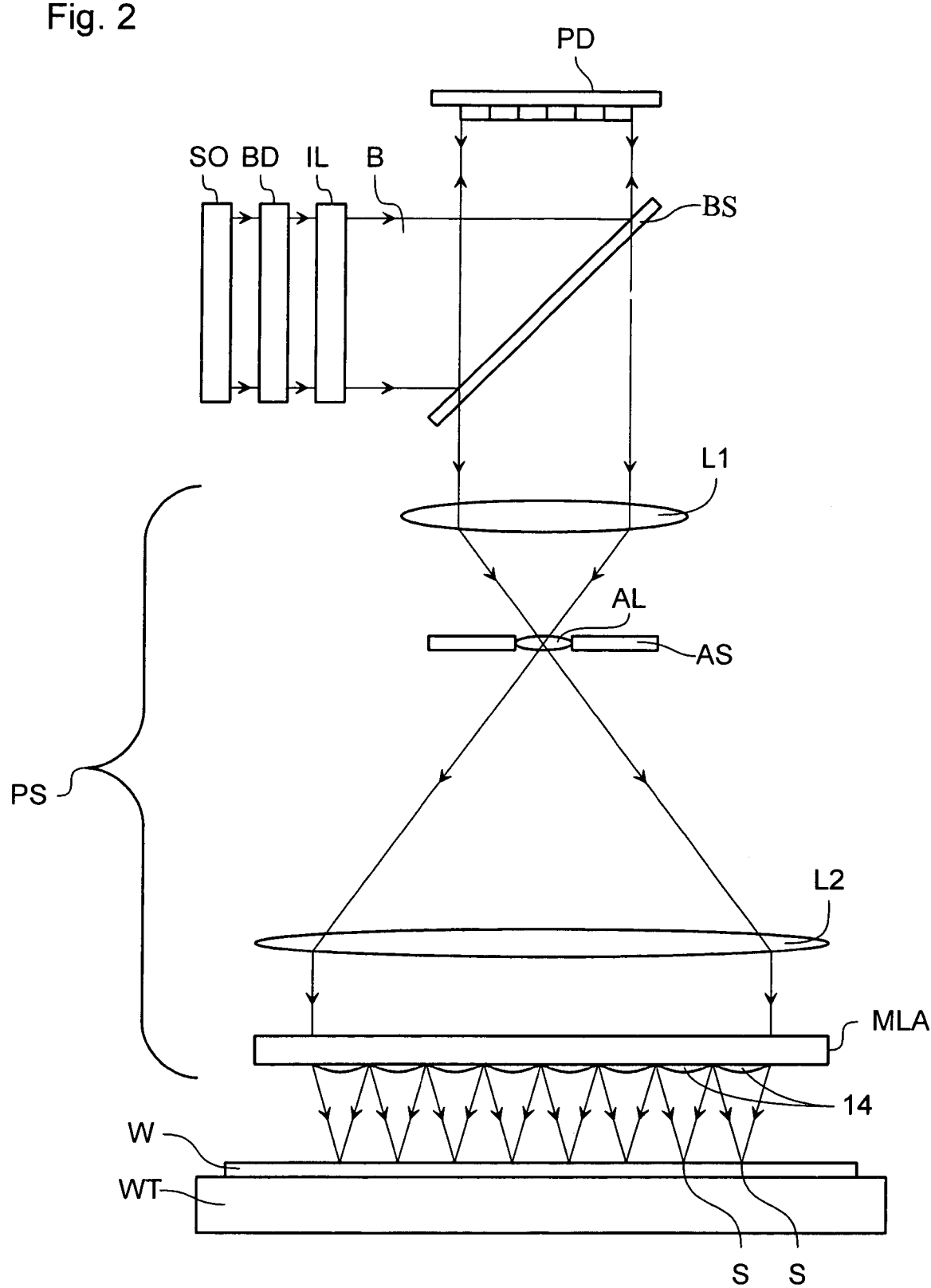

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
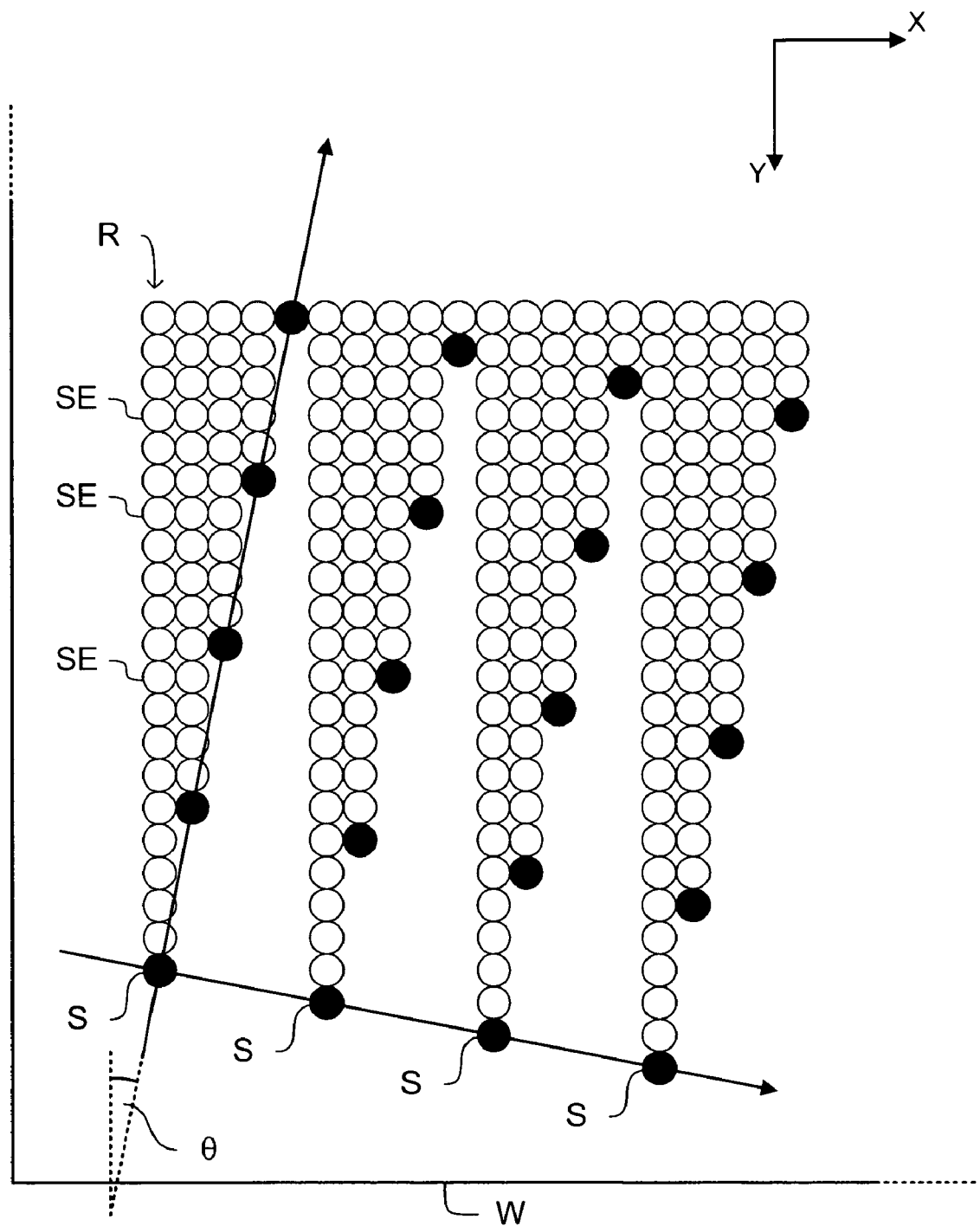
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
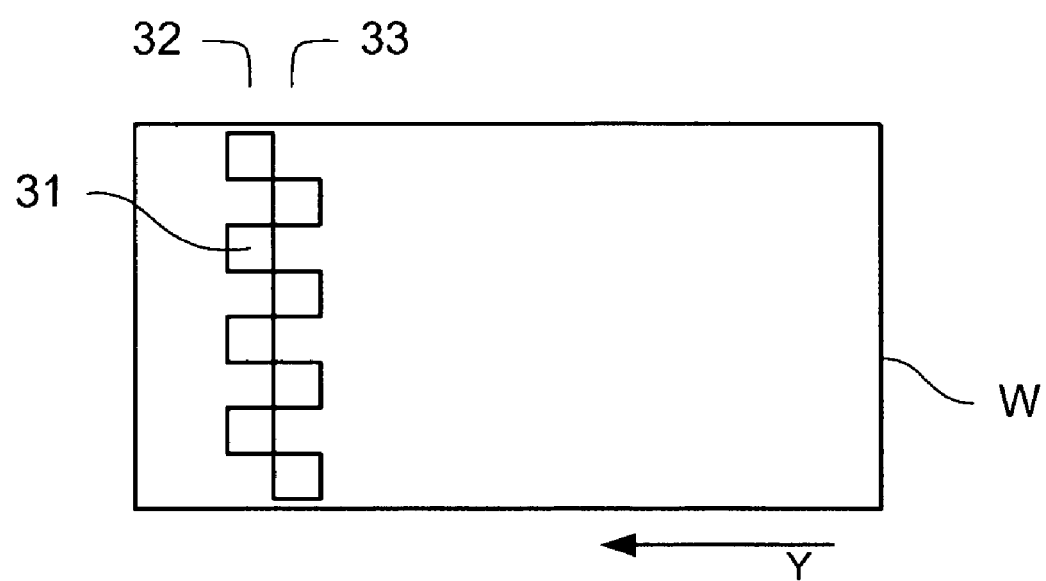
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays 31 of radiation spots S are produced by eight optical engines (not shown), arranged in two rows 32,33 in a 'chess board' configuration, such that the edge of one array of radiation spots S slightly overlaps (in the scanning direction Y) with the edge of the adjacent array of radiation spots S. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
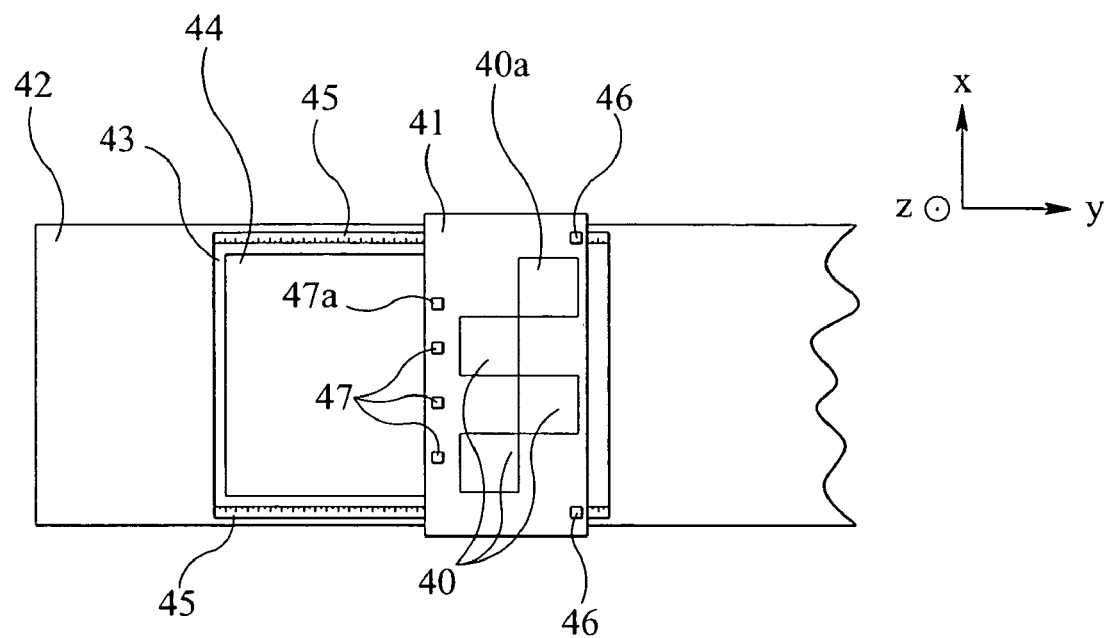
FIG. 5 depicts viewed from above a lithographic apparatus, according to one embodiment of the present invention.

FIG. 5 shows schematically how the plurality of optical engines shown in FIG. 4 can be arranged, according to one embodiment of the present invention. For ease of illustration, FIG. 5 illustrates only four optical engines (it will be appreciated that in practice any suitable number of optical engines can be used). In FIG. 5 four optical engines 40 are mounted on a support frame 41. The support frame is mounted on a base 42, and is held in a fixed position in relation to the base 42. A substrate table 43 is provided on the base 42, and is movable in the y-direction (standard Cartesian coordinates are shown in FIG. 5), in a manner which will be described further below. A substrate 44 is held on the substrate table 43, and is securely fixed to a surface of the substrate table 43. The substrate table 43 is provided with rulers 45, which extend along opposite outer sides of the substrate table 43. The support frame 41 is provided with y-position sensors 46, which look downwards onto the rulers 45 and are arranged to determine the position in the y-direction of the substrate table 43 using the rulers 45.

The support frame 41 is provided with a plurality of substrate height sensors 47, commonly referred to in the art as level sensors. The height sensors 47 look down onto the substrate 44 and determine the vertical position (i.e., the position in the z-direction) of the substrate.

In one example, the substrate table 43 and substrate 44 are moved in a continuous scanning motion in the y-direction, such that substantially the entire substrate passes beneath the optical engines 40. The optical engines 40 project a desired pattern onto the substrate 44, such that the pattern covers substantially the entire surface of the substrate 44. In this way, flat panel display circuitry, IC devices, or other devices can be formed on the substrate.

In one example, the optical engines 40 have a limited depth of focus, which can for example be around 10 microns. If the substrate 44 is not located within the focal depth of the optical engines 40, then the pattern projected by the optical engines onto the substrate will be out of focus. This will compromise the fidelity of the pattern formed on the substrate 44. In other words, the pattern will not be properly formed, with the result that elements of circuits built by the pattern may not function properly.

During scanning of the substrate 44, the height sensors 47 determine the height of a given region of the substrate. This is because the substrate 44 may not be flat, and variations in the height of the substrate can be greater than the focal depth of the optical engines 40. The height measured by a given height sensor 47a on the substrate is communicated, for example via control electronics (not illustrated) to an optical engine 40a that is located downstream in the scanning y-direction from the height sensor. After a delay determined by the time taken for the measured location on the substrate 44 to reach the optical engine 40a, the height of the focal plane formed by the optical engine 40a is adjusted so that it coincides with the measured height of the substrate 44. This ensures that the optical engine 40a projects an in-focus pattern on the substrate.

In one example, the focal planes of the optical engines 40 can be adjusted independently from one another. There are several ways in which this can be done. For example, a micro lens array of an optical engine (e.g., see FIG. 2) can be moved in the z-direction. Alternatively, the entire optical engine can be moved in the z-direction.

Figure 6:
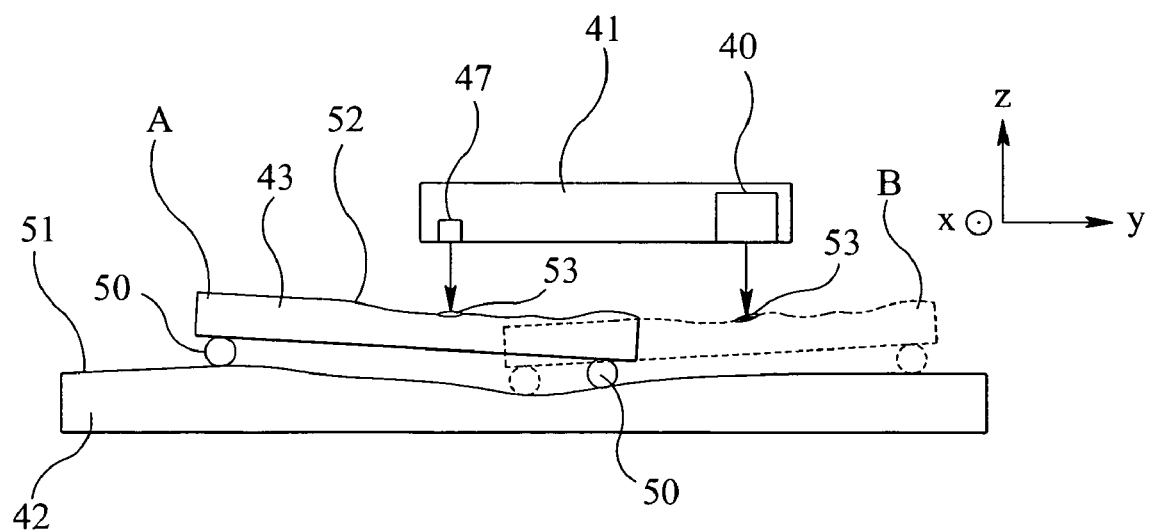
FIG. 6 depicts viewed from one side the lithographic apparatus of FIG. 5.

FIG. 6 is a side view of the apparatus shown in FIG. 5, according to one embodiment of the present invention. In one example, the accuracy with which the focal plane of the optical engine 40 is adjusted to coincide with the height of the substrate 44 can be compromised due to unevenness of the base 42. FIG. 6 shows the substrate table 43 mounted on wheels 50, which are in turn resting on a guide bar 51 that forms an upper surface of the base 42.

In one example, that the guide bar 51 is uneven. In addition, an upper surface 52 of the substrate table 43 is uneven (this is at least in part responsible for unflatness of the substrate 44 when it is held on the substrate table 43). It will be appreciated that the substrate table can be supported by other means, for example by air bearings.

In one example, the substrate table 43 is scanned in the Y direction. For purpose of illustration for this example, the substrate table is shown in only two positions: position A and position B. When the substrate table is in position A, a height sensor 47 on the support frame 41 measures the height of a particular region 53 of a substrate 44 held on the substrate table 43. The height measurement is passed to an optical engine 40, and when the substrate table 43 is in position B, the optical engine is adjusted so that the focal plane of the optical engine coincides with the measured height of the region 53 of the substrate 44. If the guide bar 51 were to be flat, then the height measured by the height sensor 47 would coincide with the correct height of the region 53 of the substrate 44 when it was underneath the optical engine 40, and an in-focus pattern would be projected onto the substrate. However, because the guide bar 51 may not be flat, but instead can have an indentation, the focal plane of the optical engine 40 is some way above the region 53 of the substrate, with the result that the pattern projected onto the substrate region 53 is out of focus.

Figure 7:
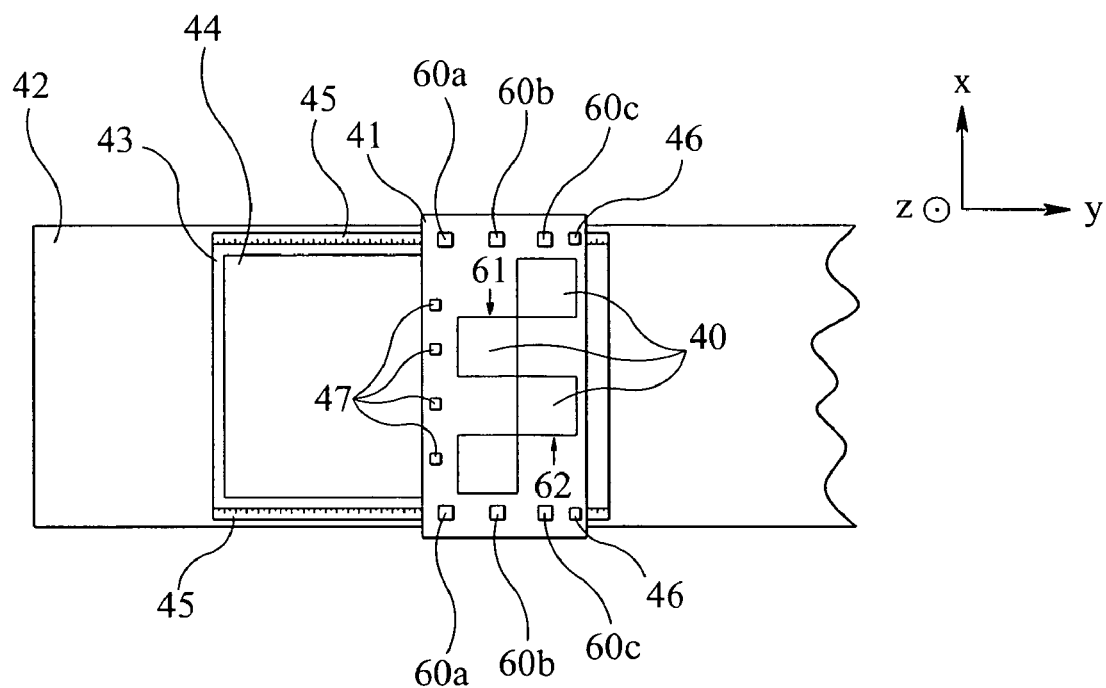
FIG. 7 depicts viewed from above a lithographic apparatus, according to one embodiment of the present invention.

FIG. 7 shows a system including additional height sensors arranged to detect the height of rulers on a substrate table, according to one embodiment of the present invention. FIG. 7 corresponds in large part to FIG. 5, and where appropriate like reference numerals have been used. Referring to FIG. 7, ruler height sensors 60 are provided at three locations at either side of the support frame 41. A first pair 60*a* of the ruler height sensors are aligned along the x-direction with the substrate height sensors 47. A second pair 60*b* of the ruler height sensors are along in the x-direction with a central region of a first row 61 of optical engines 40. A third pair of ruler height sensors 60*c* are aligned along the y-direction with a second row 62 of optical engines 40.

In one example, the ruler height sensors 60 are acoustic sensors, and are configured to measure the height of the rulers 45. The accuracy of the acoustic sensors is typically between 1 and 10 microns (a suitable acoustic sensor can be selected based upon the focal depth of the optical engines 40).

Figure 8:
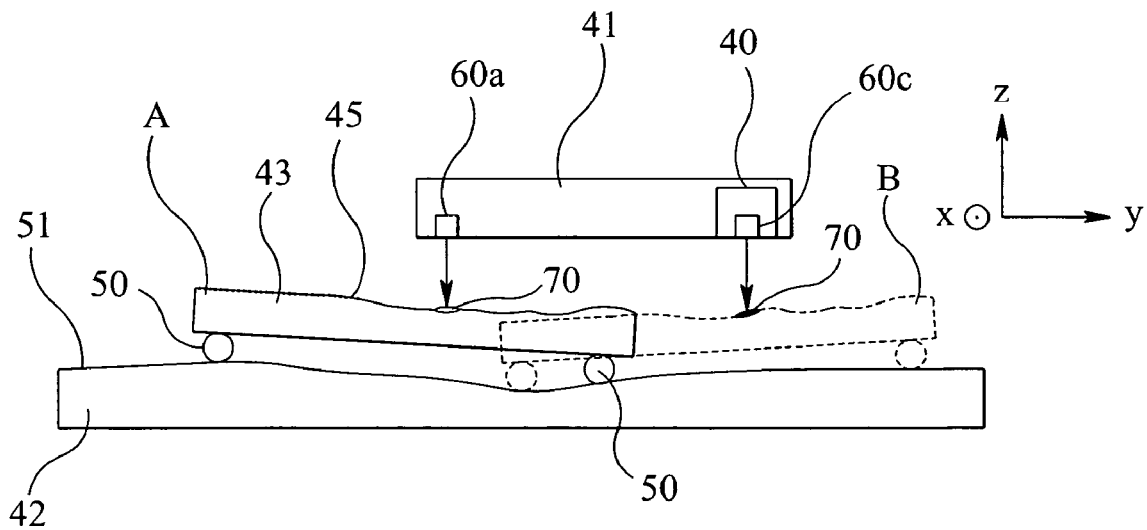
FIG. 8 depicts viewed from one side the lithographic apparatus of FIG. 7.

FIG. 8 shows a process of using a system as described above, according to one embodiment of the present invention. FIG. 8 corresponds in large part to FIG. 6, and like reference numerals have been used where appropriate. Referring to FIG. 8, when the substrate table is in position A, a first ruler height sensor 60*a* measures the height of a particular region 70 of the ruler 45. Simultaneously, height sensors (not shown) measure the height of a substrate held on the substrate table 43. The substrate table 43 moves in the y-direction to position B. A second ruler height sensor 60*c* measures the height of the particular region 70 of the ruler 45. This height is compared with the measurement performed when the substrate table was in position A. The difference between the two height measurements is determined to yield a correction offset. The correction offset indicates the deviation of the height of the particular region 70 of the ruler 45 which has occurred due to unevenness of the guide bar 51. The correction offset is used to correct the height measurement received from substrate height sensors to yield a corrected height measurement, and the corrected height measurement is used to adjust the focal plane of the optical engine 40. This can ensure that the focal plane of the optical engine 40 coincides correctly with the surface of the substrate held on the substrate table 43, and thus that the pattern projected by the optical engine 40 onto the substrate is in focus.

Although only one optical engine can be seen FIG. 8, it will be appreciated that any number of optical engines can be used. For example, referring to FIG. 7, the correction offset for the first row 61 of optical engines 40 is determined by the second pair of ruler height sensors 60*b*, and the correction offset for the second row 62 of optical engines 40 is determined by the third pair of ruler height sensors 60*c*.

In one example, the unevenness of the guide bar 51 is important only at locations at which the wheels 50 contact the guide bar 51. Wheels 50 are provided at each corner of the substrate table 43. The unevenness of the path traveled by wheels on one side of the guide bar 51 can be very different to the unevenness experienced by wheels traveling on the opposite side of the guide bar. For this reason, the ruler height sensors 60 on each side of the support frame 41 operate independently of one another. In other words, the correction offset determined by ruler height sensors 60*a*, 60*b*, 60*c* on one side of the support frame can be different to the correction offset determined by equivalent ruler height sensors 60*a*, 60*b*, 60*c* located on the opposite side of the support frame 41.

In some instances a large number of optical engines can be provided in rows across the support frame, for example two rows of four optical engines can be used (this is illustrated schematically in FIG. 4). Where this is the case, for an optical engine which is some way between the ends of the support frame, interpolation between the correction offsets determined for either end of the support frame can be used to determine an offset value for that optical engine. Comparison between the correction offsets determined for either end of the support frame are effectively tilt measurements in the Ry direction (i.e., rotation about an axis in the y-direction).

For ease of illustration, this embodiment of the invention has been described in relation to a particular region 53 of the substrate 44 (see FIG. 6) and a particular region 70 of the ruler 45 (see FIG. 8). However, it will be appreciated that in other examples the height measurements, correction offsets, and optical engine focal plane adjustments are performed continuously for the entire length of the substrate during scanning exposure of the substrate.

In general, the shape of the guide bar 51 does not change over time. This means that correction offsets measured for a given scanning exposure of a substrate 44 can be saved and used for scanning exposures of subsequent substrates. In one example, the correction offsets are saved in a memory during a first calibration scan of a substrate (the calibration scan can or may not include exposure). The correction offsets are then retrieved from the memory during each subsequent substrate exposure, thereby allowing the focal planes of the optical engines to be correctly adjusted during each substrate exposure without further measurements being needed from the ruler height sensors 60a, 60b, 60c.

In one example, the invention allows an offset measurement to be obtained without requiring the addition of an extra reference surface or surfaces to the substrate table 43. This is achieved because the surfaces of the rulers 45, which are already provided on the substrate table 43 to monitor the position of the substrate table in the y-direction, are used as the reference surfaces.

In one example, the invention corrects for deformation of the guide bar 51 and the support frame 41. The deformation occurs due to the shifting weight distribution of the substrate table 43 when it moves on the guide bar 51. The correction offsets provided substantially automatically corrects for this deformation. The deformation is elastic, and does not change over time. This means that correction offsets that are saved in a memory during a first calibration scan of a substrate, and then retrieved from the memory during each subsequent substrate exposure, will automatically correct for the deformation.

In one example, the invention surfaces of the rulers 45 do not need to be flat, because any unflatness of the rulers 45 will be automatically cancelled out from the correction offsets. This is because the location on the rulers used for a height measurement by the first pair of ruler height sensors 60a is the same as that used for a height measurement by the second and third pairs of ruler height sensors 60b, 60c, for any given correction offset.

In general, a position measurement can be made in a given direction, without the space consuming addition of an extra reference surface, by measuring the surface of a ruler which is used to monitor the position in a different, orthogonal, direction (e.g., a z-direction measurement can be made by measuring the surface of a y-direction ruler). In general, a ruler is fixed to a first reference frame, with an associated encoder being fixed to a second reference frame and arranged to monitor position in a first direction. A sensor arranged to monitor position in a second, orthogonal, direction is also fixed to the second reference frame and uses the ruler as a reference surface.

In an alternative embodiment the reference frames can comprise a reticle holder and a lithographic apparatus frame.

The term 'orthogonal direction' as used herein is intended to mean that the direction is sufficiently close to being orthogonal to another direction that a measurement in that direction will not include a significant component in the other direction.

Although the described embodiments of the invention have used acoustic sensors to obtain the offset measurement, it will be appreciated that any other suitable sensor can be used, for example a capacitance sensor, an inductive sensor, an optical sensor or a mechanical sensor. In general, the accuracy of measurement obtained using a ruler as a reference surface will be one or more orders of magnitude less than the accuracy of the measurement provided in the direction of the ruler. For example, a y-direction ruler which gives an accuracy of 100 nm in the y-direction is likely to give an accuracy of 1 micron or worse in the z-direction.

In one example, the correction offset is calculated for a given row of optical engines 40 using a pair of sensors 60b, 60c aligned along the x-direction with that row of optical engines. In an alternative embodiment, it is possibly to determine what correction offset would be needed at other locations, which are not aligned along the x-direction with a pair of sensors. This is achieved by calculating the movement between the substrate table 43 and the support frame 41 as a function of the position of the substrate table 43.

In one example, to calculate the movement of the substrate table 43, the shapes of the surfaces of the rulers 45 must be determined. On each side of the substrate table 43 there are two unknown surface shapes: the surface of the ruler 45 and the surface of the guide bar 51. These can be considered to be two unknown functions. Since there are two unknown functions and three height sensors which each measure the combined effect of those functions at different positions, substantially simultaneous linear equations can be used to determine the functions (i.e., the surface shapes). The use of substantially simultaneous linear equations to determine the functions is well known to those skilled in the art, and therefore is not described herein.

In an alternative arrangement, the surface shape of the ruler 45 can be measured in advance (for example, during assembly of the lithographic apparatus, prior to putting the substrate holder into the lithographic apparatus). A separate dedicated surface measurement tool can be used for this measurement.

Once the surface shapes of the ruler 45 has been determined, the height measurements from the pairs of sensors 60a, 60b, 60c can be interpreted and used to determine movement of the substrate table 43. This can be done for example by removing from the height measurements the effect of unflatness of the ruler 45, so that the remaining measurement indicates movement of the substrate table 43. Since there are six sensors 60a, 60b, 60c, the height measurements provided by those sensors can be used to determine movement of the substrate table in the z-direction, rotation of the substrate table about the x-direction (Rx), and rotation of the substrate table about the y-direction (Ry).

In one example, determining the movement of the substrate table in z, Rx and Ry allows more subtle correction of the focal planes of the optical engines 40, for example adjustment of the tilt of the focal planes. In general, calculating the movement of the substrate table 43 allows more accurate exposure of a pattern onto the substrate. In another example, it is not necessary that the sensors 60a, 60b, 60c be aligned along the x-direction with the substrate height sensors 47 and the rows 61, 62 of optical engines. Because the movement of the substrate table is calculated for all locations, the sensors can be in any suitable position.

In general, movement measurements for one or more additional degrees of freedom can be made by using a plurality of sensors to monitor the surface of a ruler which is intended for measurement in a different, orthogonal, direction. Measuring the surface shape of the ruler, either using the sensors or using an alternative measurement technique, allows the measurement of movement for several degrees of freedom.

In one example, the focal plane of the projection optics is adjusted if the substrate does not fall in the focal plane, it will be appreciated that it can instead or in addition be possible to move the substrate in the z-direction.

The use of the term 'height' is intended to mean position in a direction which is substantially perpendicular to the substrate surface (this is conventionally denoted as the z-direction). It is not intended to be limited only to distance in the vertical direction; for example for situations in which the substrate is not horizontal.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
   a first frame, and
   a second frame,
   wherein the first frame and the second frame are moveable in a first direction relative to one another, the first frame being provided with a ruler having distance indicators disposed in the first direction for monitoring by an associated ruler monitoring sensor, and
   wherein the second frame is provided with a second sensor arranged to measure a distance between the second sensor and the ruler in a second direction orthogonal to the first direction, using the ruler as a reference surface.

2. The lithographic apparatus according to claim 1, wherein:
   the first frame comprises a holder;
   the lithographic apparatus further comprises a substrate height sensor that measures a height of a substrate held by the holder; and
   the second sensor is located adjacent to the substrate height sensor and measures a distance between the second sensor and the ruler at that location.

3. The lithographic apparatus according to claim 2, wherein the lithographic apparatus further comprises:
   projection optics that project a desired pattern onto the substrate; and
   a third sensor located adjacent to the projection optics and measuring a distance between the third sensor and the ruler at that location.

4. The lithographic apparatus according to claim 1, wherein:
   the first frame comprises a holder;
   the lithographic apparatus further comprises a substrate height sensor that measures a height of a substrate held by the holder; and
   the second sensor is in a position which is not adjacent to the substrate height sensor and measures a distance between the second sensor and the ruler at that position.

5. The lithographic apparatus according to claim 4, wherein the lithographic apparatus further comprises:
   projection optics that project a desired pattern onto the substrate; and
   a third sensor positioned unadjacent to the projection optics and measuring a distance between the third sensor and the ruler at that position.

6. The lithographic apparatus according to claim 5, wherein the lithographic apparatus is provided with an adjustment mechanism that adjusts a focal plane of the projection optics based upon measurements provided by the second and third sensors.

7. The lithographic apparatus according to claim 5, wherein the apparatus further comprises two or more rows of projection optics, and a fourth sensor is located adjacent to each row of projection optics.

8. The lithographic apparatus according to claim 5, wherein the second and third sensors are provided on one side of the frame, and corresponding sensors are provided on an opposite side of the frame.

9. The lithographic apparatus according to claim 5, further comprising a memory that either stores measurements provided by the second and third sensors or values calculated using those measurements.

10. The lithographic apparatus according to claim 1, wherein the second sensor is an acoustic sensor, a capacitance sensor, an inductive sensor, an optical sensor, or a mechanical sensor.

11. The lithographic apparatus according to claim 1, wherein the first frame is a substrate holder.

12. The lithographic apparatus according to claim 1, wherein the first frame is a reticle holder.

13. The lithographic apparatus according to claim 1, further comprising a memory that stores a measurement of a surface shape of the ruler.

14. The lithographic apparatus according to claim 13, further comprising a processor that uses the measured distance between the ruler and the second sensor, and the stored measurement of the surface shape of the ruler, to measure movement in the second direction between the first frame and the second frame.

15. A measurement apparatus, comprising:
    a ruler including distance indicators disposed in a first direction for monitoring by an associated ruler monitoring sensor; and
    a second sensor that measures a distance between the second sensor and the ruler in a second direction orthogonal to the first direction, using the ruler as a reference surface.

16. The measurement apparatus according to claim 15, wherein the measurement apparatus forms part of a lithographic apparatus.

17. A method, comprising:
(a) providing a substrate holder with a ruler having distance indicators disposed in a first direction;
(b) providing a frame with a height sensor that measures a height of a substrate held by the substrate holder;
(c) providing projection optics that project a desired pattern onto the substrate,
(d) measuring a height of the ruler with a second sensor located adjacent to the height sensor;
(e) moving the substrate holder and substrate relative to the projection optics;
(f) measuring the height of the ruler using a third sensor located adjacent to the projection optics;
(g) determining a correction offset based upon the difference between the measured heights of the ruler; and
(h) using the correction offset together with the measured height of the substrate to adjust the projection optics, such that the projection optics project an in-focus pattern onto the substrate.

18. The method according to claim 17, wherein the correction offset is determined in real time during projection of the pattern onto the substrate.

19. The method according to claim 17, wherein the correction offset is stored in a memory and is retrieved during projection of the pattern onto the substrate.

20. The method according to claim 19, wherein the correction offset comprises a set of values.

21. A flat panel display manufactured according to the method of claim 17.

22. A method of lithographic exposure using a lithographic apparatus, comprising:
(a) providing a first frame with a ruler having distance indicators disposed in a first direction;
(b) providing a second frame with a plurality of sensors that measure a distance between the plurality of sensors and the ruler in a second direction orthogonal to the first direction, using the ruler as a reference surface,
(c) measuring a surface flatness of the ruler; and
(d) using the plurality of sensors to measure movement of the first frame relative to the second frame in the second direction, during scanning movement of the first frame relative to the second frame in the first direction.

23. The method according to claim 22, wherein the measurement of the surface flatness of the ruler is performed using a dedicated sensor.

24. The method according to claim 22, wherein the measurement of the surface flatness of the ruler is performed using the plurality of sensors.

25. A measurement method, comprising:
(a) using a ruler having distance indicators disposed in a first direction for monitoring by an associated ruler monitoring sensor; and
(b) measuring with a sensor a distance between the sensor and the ruler in a second direction orthogonal to the first direction, using the ruler as a reference surface.

* * * * *